United States Patent
Bai et al.

(10) Patent No.: US 12,080,722 B2
(45) Date of Patent: Sep. 3, 2024

(54) PIXEL ARRAY, DISPLAY PANEL, AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventors: Yichen Bai, Guangdong (CN); Zhijuan Long, Guangdong (CN); Hongquan Wei, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/612,991

(22) PCT Filed: Oct. 25, 2021

(86) PCT No.: PCT/CN2021/125963
§ 371 (c)(1),
(2) Date: Nov. 19, 2021

(87) PCT Pub. No.: WO2023/035371
PCT Pub. Date: Mar. 16, 2023

(65) Prior Publication Data
US 2024/0038772 A1 Feb. 1, 2024

(30) Foreign Application Priority Data

Sep. 8, 2021 (CN) .......................... 202111049375.3

(51) Int. Cl.
*H01L 27/12* (2006.01)
*G09G 3/36* (2006.01)

(52) U.S. Cl.
CPC ......... *H01L 27/124* (2013.01); *G09G 3/3614* (2013.01); *G09G 2300/0426* (2013.01); *G09G 2320/0209* (2013.01)

(58) Field of Classification Search
CPC ......... G09G 3/3614; G09G 2300/0426; G09G 2320/0209; G09G 3/3648;
(Continued)

(56) References Cited

U.S. PATENT DOCUMENTS 6,340,998 B1   1/2002  Kim et al.
2011/0032249 A1   2/2011  Moon
(Continued)

FOREIGN PATENT DOCUMENTS

CN   101285950 A   10/2008
CN   101997008 A   3/2011
(Continued)

OTHER PUBLICATIONS

International Search Report in International application No. PCT/CN2021/125963, mailed on May 27, 2022.

*Primary Examiner* — Karen Kusumakar
(74) *Attorney, Agent, or Firm* — PV IP PC; Wei Te Chung; Zhigang Ma

(57) ABSTRACT

A pixel array, a display panel, and a display device are provided. The pixel array includes a first pixel electrode, a first data line, and a second data line. The first pixel electrode includes a first side and a second side opposite to the first side. The first data line is electrically connected to the first pixel electrode. The first data line is adjacent to the first side of the first pixel electrode and extends to the second side. The second data line is adjacent to the first data line. At least a portion of the second data line is disposed between the second side and the first data line. The first data line and the
(Continued)

second data line are respectively configured to transmit signals with opposite polarities.

19 Claims, 5 Drawing Sheets

(58) Field of Classification Search
CPC ........... G02F 1/134309; G02F 1/13306; G02F 1/134318; G02F 1/136213; G02F 1/136286

See application file for complete search history.

(56) References Cited

U.S. PATENT DOCUMENTS

| | | |
|---|---|---|
| 2013/0314389 A1 | 11/2013 | Wang et al. |
| 2017/0192570 A1 | 7/2017 | Choi et al. |
| 2022/0139961 A1* | 5/2022 | Mu .................. G02F 1/136286 257/72 |
| 2022/0382110 A1* | 12/2022 | Wang ................ H01L 27/1259 |

FOREIGN PATENT DOCUMENTS

| | | |
|---|---|---|
| CN | 102436103 A | 5/2012 |
| CN | 202948235 U | 5/2013 |
| CN | 104267551 A | 1/2015 |
| CN | 105068344 A | 11/2015 |
| CN | 207380420 U | 5/2018 |
| CN | 110286537 A | 9/2019 |
| CN | 111323977 A | 6/2020 |
| CN | 111427211 A | 7/2020 |
| CN | 112365831 A | 2/2021 |
| JP | 102108027 A | 4/1990 |
| JP | 2012237943 A | 12/2012 |
| KR | 20060025785 A | 3/2006 |
| TW | 201027208 A | 7/2010 |
| WO | 2006070332 A1 | 7/2006 |

* cited by examiner

PIXEL ARRAY, DISPLAY PANEL, AND DISPLAY DEVICE

FIELD OF DISCLOSURE

The present disclosure relates to the field of display technologies, in particular to a pixel array, a display panel, and a display device.

BACKGROUND

With the development of panel industries, a resolution and a refresh frequency of panels have also increased, but this has also led to an increase in a number of chip on film (COF) installed in a source driver, thereby increasing a risk of COF bonding failure and increasing costs. Thus, a data line share (DLS) structure is proposed. In the DLS structure, the number of COFs is reduced to half of a traditional structure, which reduces a risk of bonding failure and costs caused by disposing multiple COFs.

FIG. 1 shows a schematic diagram of a display panel 10 in the prior art. The display panel 10 includes a plurality of data lines D1-D2, a plurality of gate lines G1-G6, and a plurality of pixels P. The plurality of pixels include a plurality of red pixels R, a plurality of green pixels G, and a plurality of blue pixels B. The display panel 10 adopts the DLS structure, that is, pixels arranged in different columns are connected to a same data line. Two adjacent data lines transmit signals with opposite polarities.

As shown in FIG. 1, distances between each pixel and two adjacent data lines are different, resulting in unequal coupling capacitances between each pixel and two adjacent data lines. Taking a green pixel G arranged in a first row and a second column as an example, a distance between the green pixel G and a first data line D1 is less than a distance between the green pixel G and a second data line D2, so a coupling capacitance CpdL between the green pixel G and the first data line D1 is much larger than a coupling capacitance CpdR between the green pixel G and the second data line D2. The difference in the coupling capacitances between the pixel and two adjacent data lines will cause problems such as poor display quality and vertical crosstalk.

Accordingly, it is necessary to provide a pixel array, a display panel, and a display device to solve the problems existing in the prior art.

SUMMARY OF DISCLOSURE

In order to solve the above-mentioned problems in the prior art, a purpose of the present disclosure is to provide a pixel array, a display panel, and a display device to improve a display quality.

To achieve the above purpose, the present disclosure provides a pixel array, including: a first pixel electrode including a first side and a second side opposite to the first side; a first data line electrically connected to the first pixel electrode, wherein the first data line is adjacent to the first side of the first pixel electrode and extends to the second side; and a second data line adjacent to the first data line, wherein at least a portion of the second data line is disposed between the second side and the first data line, and the first data line and the second data line are respectively configured to transmit signals with opposite polarities.

In some embodiments, a coupling capacitance between the first pixel electrode and the first data line and a coupling capacitance between the first pixel electrode and the second data line are similar in value and opposite in polarity.

In some embodiments, the first data line includes: a first trunk portion extending along a column direction, configured to electrically connect a plurality of pixel electrodes arranged along the column direction, and adjacent to the first side of the first pixel electrode; and a first branch portion extending from the first trunk portion to the second side of the first pixel electrode.

In some embodiments, the first branch portion includes: a first longitudinal portion extending along the column direction and adjacent to the second side of the first pixel electrode; and a first transverse portion extending along a row direction and configured to connect the first trunk portion and the first longitudinal portion.

In some embodiments, the second data line includes: a second trunk portion extending along the column direction and configured to connect to a plurality of pixel electrodes arranged along the column direction; a second longitudinal portion extending along the column direction and disposed between the second side of the first pixel electrode and the first branch portion of the first data line; and a second transverse portion extending along the row direction and configured to connect the second trunk portion and the second longitudinal portion.

In some embodiments, widths of the first trunk portion of the first data line and the second longitudinal portion of the second data line are equal; and a distance between the first side of the first pixel electrode and the first trunk portion is equal to a distance between the second side of the first pixel electrode and the second longitudinal portion.

In some embodiments, the pixel array further includes a second pixel electrode disposed between the first pixel electrode and the second data line, wherein the second pixel electrode includes a third side and a fourth side opposite to the third side, the second trunk portion of the second data line is adjacent to the third side of the second pixel electrode, and the first branch portion of the first data line extends to a position between a second branch portion of the second data line and the fourth side of the second pixel electrode.

In some embodiments, the pixel array further includes a common electrode disposed between the first pixel electrode and the second pixel electrode, wherein the common electrode includes at least one slit, and at least part of orthographic projections of the first data line and the second data line on the common electrode is in the at least one slit of the common electrode.

The present disclosure also provides a display panel, including: a plurality of data lines extending along a column direction, wherein two adjacent data lines transmit signals with opposite polarities; a plurality of gate lines extending along a row direction; and a plurality of pixel electrodes arranged in an array along the row direction and the column direction, wherein two columns of the pixel electrodes are disposed between two adjacent data lines, and two gate lines are disposed between two adjacent rows of the pixel electrodes; wherein the data line further includes a branch portion, and the branch portion extends to a position between two adjacent columns of the pixel electrodes.

In some embodiments, the two adjacent data lines includes a first data line and a second data line, and the two adjacent columns of the pixel electrodes includes a first column of the pixel electrodes and a second column of the pixel electrodes, wherein the first data line is adjacent to the first column of the pixel electrodes, and the second data line is adjacent to the second column of the pixel electrodes; and wherein a branch portion of the first data line extends to a position between the second column of the pixel electrodes and the branch portion of the second data line, and a branch portion of the second data line extends to a position between the first column of the pixel electrodes and the branch portion of the first data line.

In some embodiments, the two columns of the pixel electrodes disposed between the two adjacent data lines are correspondingly connected to one of the data lines. The present disclosure also provides a display device, including: a pixel array including: a first pixel electrode including a first side and a second side opposite to the first side; a first data line electrically connected to the first pixel electrode, wherein the first data line is adjacent to the first side of the first pixel electrode and extends to the second side; and a second data line adjacent to the first data line, wherein at least a portion of the second data line is disposed between the second side and the first data line, and the first data line and the second data line are respectively configured to transmit signals with opposite polarities; a controller configured to generate data control signals; and a source driver connected to the controller and the first data line or the second data line of the pixel array, and configured to generate signals with corresponding polarities according to the data control signals to control the first data line and the second data line transmitting the signals with opposite polarities.

In some embodiments, a coupling capacitance between the first pixel electrode and the first data line and a coupling capacitance between the first pixel electrode and the second data line are similar in value and opposite in polarity.

In some embodiments, the first data line includes: a first trunk portion extending along a column direction, configured to electrically connect a plurality of pixel electrodes arranged along the column direction, and adjacent to the first side of the first pixel electrode; and a first branch portion extending from the first trunk portion to the second side of the first pixel electrode.

In some embodiments, the first branch portion includes: a first longitudinal portion extending along the column direction and adjacent to the second side of the first pixel electrode; and a first transverse portion extending along a row direction and configured to connect the first trunk portion and the first longitudinal portion.

In some embodiments, the second data line includes: a second trunk portion extending along the column direction and configured to connect to a plurality of pixel electrodes arranged along the column direction; a second longitudinal portion extending along the column direction and disposed between the second side of the first pixel electrode and the first branch portion of the first data line; and a second transverse portion extending along the row direction and configured to connect the second trunk portion and the second longitudinal portion.

In some embodiments, widths of the first trunk portion of the first data line and the second longitudinal portion of the second data line are equal; and a distance between the first side of the first pixel electrode and the first trunk portion is equal to a distance between the second side of the first pixel electrode and the second longitudinal portion.

In some embodiments, the pixel array further includes a second pixel electrode disposed between the first pixel electrode and the second data line, the second pixel electrode includes a third side and a fourth side opposite to the third side, the second trunk portion of the second data line is adjacent to the third side of the second pixel electrode, and the first branch portion of the first data line extends to a position between a second branch portion of the second data line and the fourth side of the second pixel electrode.

In some embodiments, the pixel array further includes a common electrode disposed between the first pixel electrode and the second pixel electrode, the common electrode includes at least one slit, and at least part of orthographic projections of the first data line and the second data line on the common electrode is in the at least one slit of the common electrode.

In comparison with the prior art, the present disclosure provides two adjacent columns of pixels between two adjacent data lines, and each of the two adjacent data lines includes branch portions extending between the two adjacent columns of pixels, so that opposite sides of each pixel are adjacent to the data lines. Moreover, the two adjacent data lines transmit signals with opposite polarities, and the polarities of coupling capacitances on both sides of each pixel are opposite, which can cancel each other out. Therefore, the problems of poor image quality and vertical crosstalk caused by the unequal coupling capacitances on both sides of the pixel is improved. Furthermore, the common electrode including the slit can effectively reduce the coupling capacitance between the branch portion of the data line and the common electrode, thereby preventing a problem of low panel charging efficiency due to an excessive coupling capacitance.

BRIEF DESCRIPTION OF DRAWINGS

The following describes specific embodiments of the present disclosure in detail with reference to accompanying drawings to make technical solutions and other beneficial effects of the present disclosure obvious.

DETAILED DESCRIPTION

The technical solutions in the embodiments of the present disclosure will be clearly and completely described below in conjunction with the drawings in the embodiments of the present disclosure. Apparently, the described embodiments are only a part of the embodiments of the present disclosure, rather than all the embodiments. Based on the embodiments in the present disclosure, all other embodiments obtained by those skilled in the art without creative efforts shall fall within the scope of protection of the present disclosure.

Figure 1:
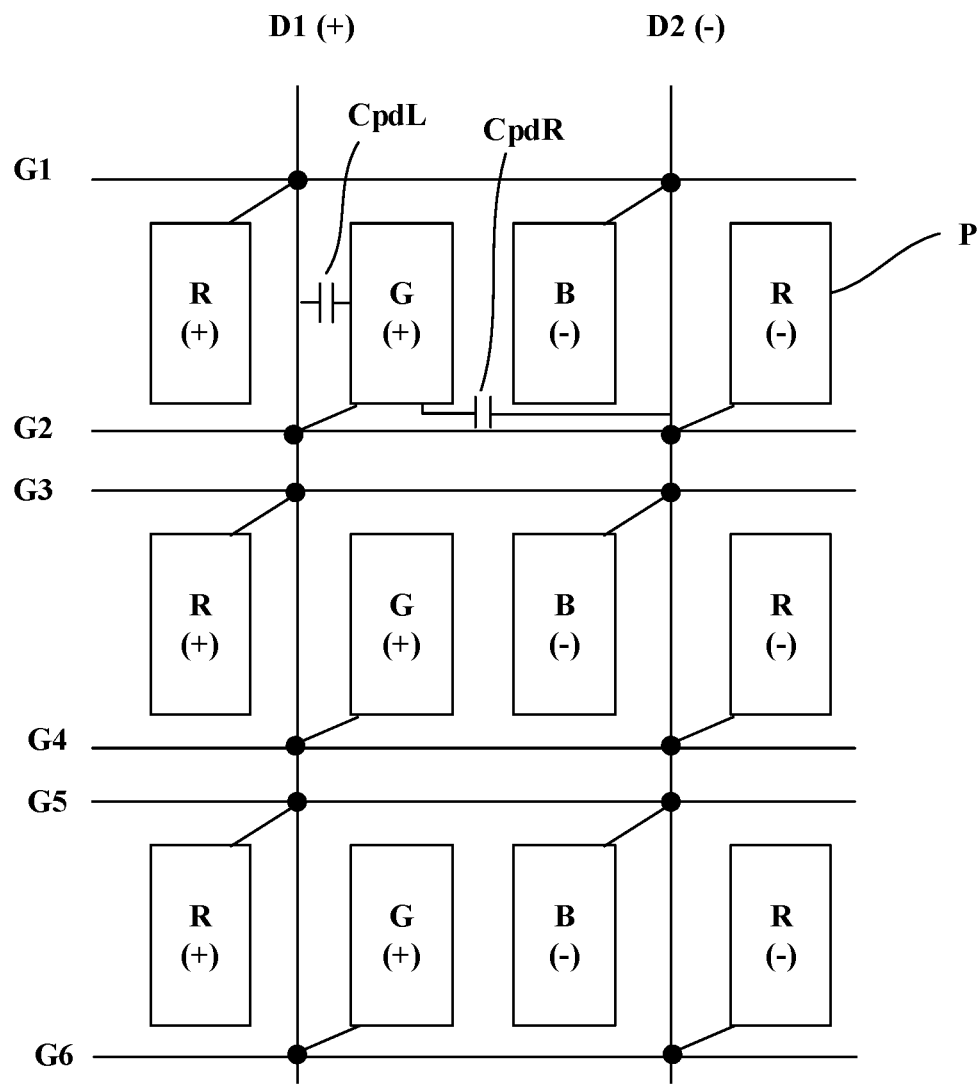
FIG. 1 shows a schematic diagram of a display panel in the prior art.
Figure 2:
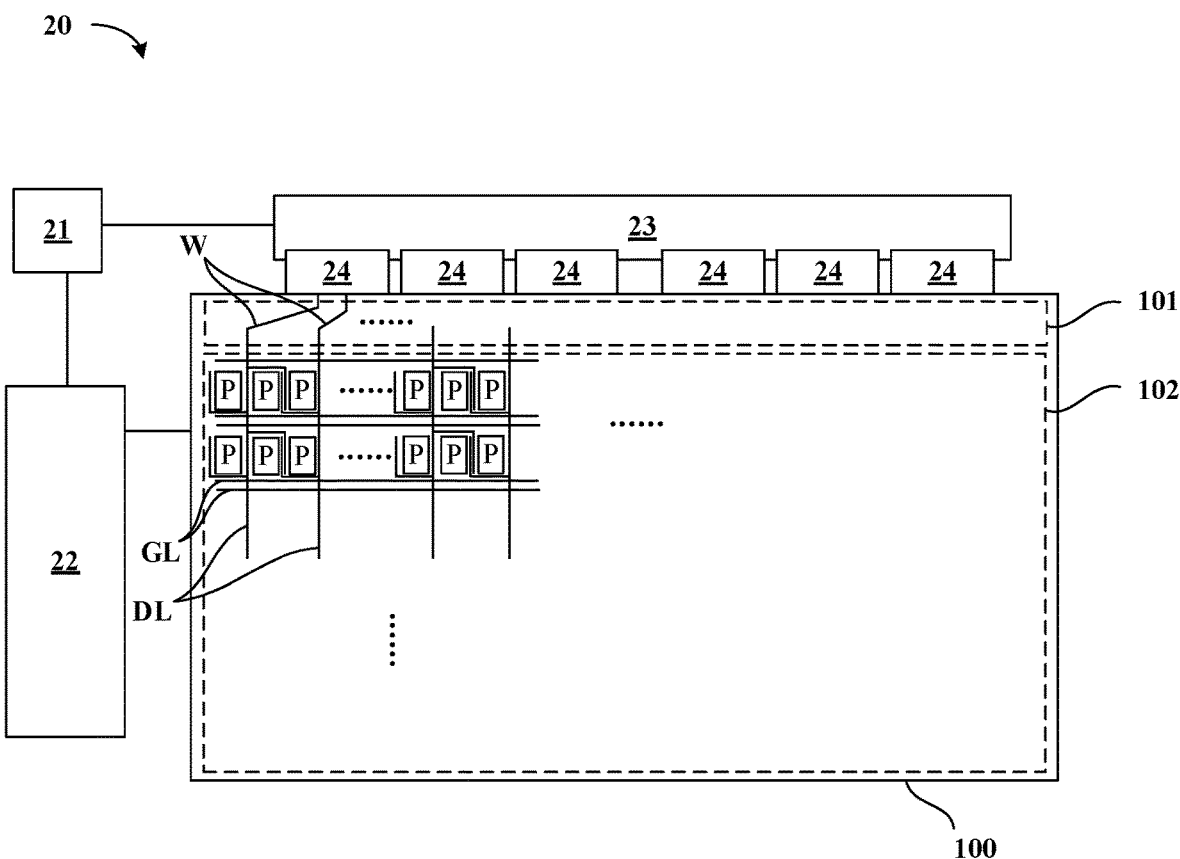
FIG. 2 shows a schematic diagram of a display device according to an embodiment of the present disclosure.

Referring to FIG. 2, which shows a schematic diagram of a display device according to an embodiment of the present disclosure. The display device 20 includes a display panel 100, a controller 21, a gate driver 22, a source driver 23, and a plurality of connectors 24. The controller 21 is connected to a power supply to provide power to the display device 20, and then controls the display device 20 to be turned on or off. The controller 21 may include a timing controller, a microprocessor, a gamma voltage generator, and so on. The controller 21 is connected to the gate driver 22 and the source driver 23, and the gate driver 22 and the source driver 23 are connected to the display panel 100. The connectors 24 are configured to bond the source driver 23 to the display panel 100. The connector 24 may include, but is not limited to, a chip on film (COF). The display panel 100 includes a plurality of data lines DL, a plurality of gate lines GL, and a plurality of pixels P. The plurality of data lines DL extend along a column direction, the plurality of gate lines GL extend along a row direction, and the plurality of pixels P are arranged in an array along the row direction and the column direction. The source driver 23 is connected to the plurality of pixels P correspondingly through the plurality of data lines DL. The source driver 23 is connected to the plurality of pixels P correspondingly through the plurality of gate lines GL. The plurality of pixels P include pixels of different colors, such as red pixels, green pixels, blue pixels, or white pixels, and are configured to correspondingly emit red, green, blue, or white light.

As shown in FIG. 2, the controller 21 is configured to generate gate control signals and data control signals. The gate driver 22 generates gate signals according to the gate control signals, and transmits the gate signals to the plurality of pixels P through the plurality of gate lines GL. On the other hand, the controller 21 transmits the data control signals (such as, analog video signals, reference gamma voltage signals, etc.) to the source driver 23. The source driver 23 generates corresponding data signals according to the data control signals, and transmits the data signals to the plurality of pixels P through the plurality of data lines DL.

As shown in FIG. 2, the display panel 100 includes a wiring area 101 and a display area 102. A plurality of wirings W are disposed on the wiring area 101. The plurality of pixels P, the plurality of data lines DL, and the plurality of gate lines GL are disposed on the display area 102. The plurality of wirings W in the wiring area 101 are configured to connect the source driver 23 and the corresponding plurality of data lines DL through the connector 24. When the display device 20 is turned on, the controller 21 acquires image data signals about a frame of an image to generate the corresponding gate control signals and data control signals, and then controls the display area 102 of the display panel 100 to display the image.

As shown in FIG. 2, in this embodiment, the pixels arranged in a same row are controlled by two adjacent gate lines, and two gate lines are arranged between the two adjacent rows of pixels. The pixels arranged in different columns are connected to a same data. line. In turn, a data line share (DLS) structure is realized. Therefore, in this embodiment, the number of connectors 24 used to connect the source driver 23 and the display panel 100 can be reduced to half of a traditional structure, thereby reducing a risk of bonding failure and costs caused by disposing multiple connectors.

Figure 3:
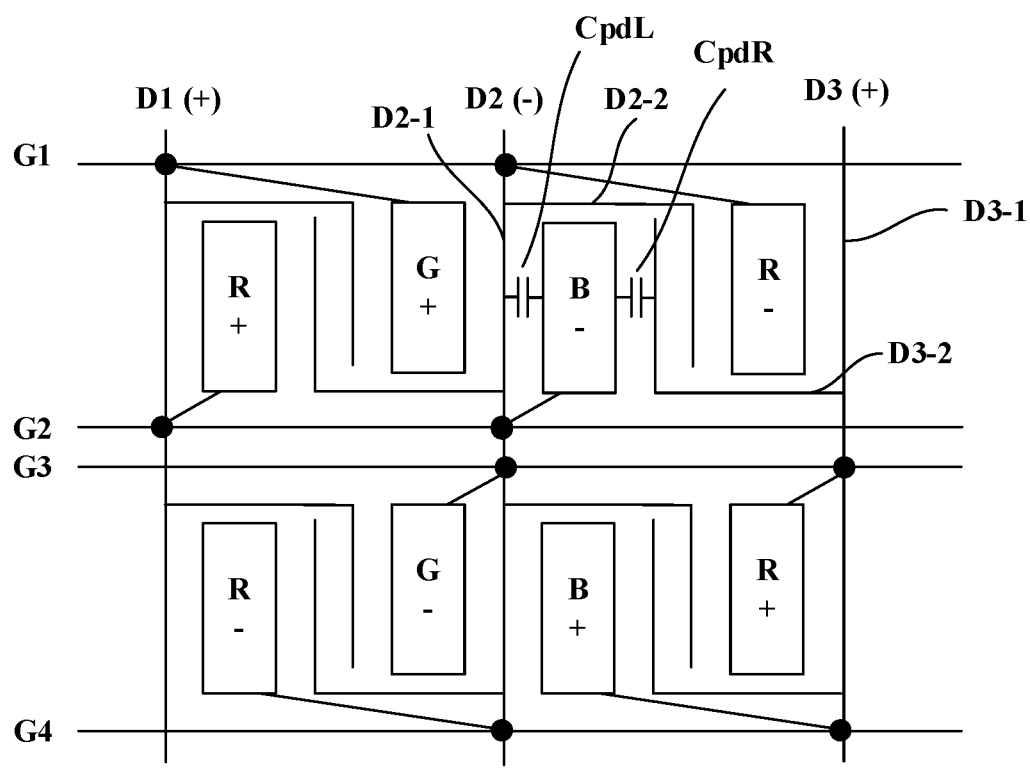
FIG. 3 shows a schematic diagram of a display panel according to an embodiment of the present disclosure.

Referring to FIG. 3, which shows a schematic diagram of a display panel 200 according to a first embodiment of the present disclosure. The display panel 200 includes a plurality of pixels, a plurality of data lines D1-D3, and a plurality of gate lines G1-G4. The plurality of pixels includes a plurality of red pixels R, a plurality of green pixels G, and a plurality of blue pixels B. Each pixel P includes a pixel electrode. Two columns of the pixel electrodes are arranged between two adjacent data lines, and each data line is alternately connected to the pixel electrodes arranged in four columns. In this embodiment, the alternate connection of the data line means that the data line connects odd-numbered rows of the pixel electrodes or even-numbered rows of the pixel electrodes in two adjacent columns of the pixel electrodes, and connects odd-numbered rows of the pixel electrodes or even-numbered rows of the pixel electrodes in another two adjacent columns of the pixel electrodes. For example, in this embodiment, the display panel 200 includes first to fourth columns of the pixel electrodes arranged in sequence. The second data line D2 is disposed between the second column of the pixel electrodes and the third column of the pixel electrodes. The second data line D2 connects the pixel electrodes arranged in a first row and the third and fourth columns, and connects the pixel electrodes arranged in a second row and the first and second columns.

As shown in FIG. 3, the pixel electrodes arranged in the same row are controlled by two adjacent gate lines, and two gate lines are disposed between the pixel electrodes of two adjacent rows. For example, the pixel electrodes of the first row are disposed between a first gate line G1 and a second gate line G2. The second gate line G2 and a third gate line G3 are disposed between the pixel electrodes of the first row and the pixel electrodes of the second row. In this embodiment, the pixel electrode arranged in the same row are correspondingly connected to two adjacent gate lines. For example, the first gate line G1 is correspondingly connected to at least one pixel electrode arranged in the first row, and the second gate line G2 is correspondingly connected to at least another one pixel electrode arranged in the first row. Similarly, the third gate line G3 is correspondingly connected to at least one pixel electrode arranged in the second row, and the fourth gate line G4 is correspondingly connected to at least another one pixel electrode arranged in the second row. It should be understood that the corresponding connections of the gate lines include ordered or disordered connections. That is, two adjacent gate lines can be correspondingly connected to the pixel electrodes arranged in a same row with the same or different number of pixel electrodes as intervals.

It should be understood that, in this embodiment, the display panel 200 includes a liquid crystal. A liquid crystal cell corresponding to each pixel has its own signal polarity. In order to prevent the polarization of the liquid crystal, it is necessary to drive the liquid crystal cell by alternately changing a polarity electric field. That is, a polarity of a voltage applied to each liquid crystal cell is inversed during two consecutive frames. For the liquid crystal cell, if the voltage polarity is driven positive in a current time frame, the voltage polarity is then driven negative in a next time frame. Specifically, when the display device 20 is turned on, the controller 21 generates a corresponding data control signal according to the image data signal. The source driver 23 generates a data signal having a corresponding polarity and voltage value according to the received data control signal, and transmits the data signal to the plurality of pixels P through the plurality of data lines DL. In addition, whether or not horizontal crosstalk occurs when the display device 200 displays the image is strongly related to the pixel polarity. If two adjacent pixels have opposite column inversion voltage polarity patterns, an overall perceived crosstalk can be reduced. Specifically, in this embodiment, two adjacent data lines transmit signals of opposite polarities, and when the gate line in a row is turned on, the corresponding connected pixels will be charged at the same time. If voltages applied to two adjacent pixels are the same in magnitude but opposite in polarity, the coupling capacitances with the common electrode can be eliminated, thereby avoiding crosstalk. As shown in FIG. 3, through the pixel circuit of the display panel 200 of the present disclosure, the polarity of the pixel can be inversed every two pixels in a row of pixels, that is, a two-dot inversion (2 dot inversion) driving of the row direction is realized to improve the horizontal crosstalk problem of the display panel and improve the image quality of the display panel.

As shown in FIG. 3, two adjacent columns of the pixel electrodes are disposed between two adjacent data lines, and each of the two adjacent data lines includes branch portions extending between the two adjacent columns of the pixel electrodes. The two adjacent data lines include a first data line and a second data line, and the two adjacent columns of the pixel electrodes include a first column of the pixel electrodes and a second column of the pixel electrodes. The first data line is adjacent to the first column of the pixel electrodes, and the second data line is adjacent to the second column of the pixel electrodes. The branch portion of the first data line extends to a position between the second column of the pixel electrodes and the branch portion of the second data line, and the branch portion of the second data line extends to a position between the first column of the pixel electrodes and the branch portion of the first data line. For example, the second data line D2 and the third data line D3 are adjacent to each other, and adjacent third and fourth column pixel electrodes are disposed between the second data line D2 and the third data line D3. The second data line D2 includes a trunk portion D2-1 and a plurality of branch portions D2-2, and the third data line D3 includes a trunk portion D3-1 and a plurality of branch portions D3-2. The trunk portion D2-1 of the second data line D2 is disposed on one side of the third column of the pixel electrodes, and the branch portion D2-2 of the second data line D2 extends to a position between the third column of the pixel electrodes and the fourth column of the pixel electrodes. In addition, the trunk portion D3-1 of the third data line D3 is disposed on one side of the fourth column of the pixel electrodes, and the branch portion D3-2 of the third data line D3 extends to a position between the third column of the pixel electrodes and the fourth column of the pixel electrodes.

As shown in FIG. 3, the branch portion D2-2 of the second data line D2 extends to a position between the other side of the fourth column of the pixel electrode and the branch portion D3-2 of the third data line D3, and the branch portion D3-2 of the third data line D3 extends to a position between the third column of the pixel electrode and the branch portion D2-2 of the second data line D2. In this embodiment, the second data line D2 and the third data line D3 respectively transmit signals with opposite polarities. When the gate lines transmit the driving signals line by line, the corresponding connected pixels will be charged accordingly. Therefore, two sides of one column of the pixel electrodes are adjacent to the data lines of opposite polarities. For example, one side of the pixel electrode arranged in the third column is adjacent to the trunk portion D2-1 of the second data line D2, and the opposite side of the pixel electrode arranged in the third column is adjacent to the branch portion D3-2 of the third data line D3.

As shown in FIG. 3, in the present disclosure, two adjacent data lines with opposite polarities extend along both sides of the pixel electrodes arranged in same column, so that the polarities of the coupling capacitances on both sides of each pixel electrode are opposite, which can cancel each other out. That is, the opposite sides of each pixel electrode are adjacent to the data lines, and there is no other pixel electrode disposed between the side of the pixel electrode and the data line, so that a value of a coupling capacitance CpdL between a pixel electrode and one of the data lines is similar to a coupling capacitance CpdR between the pixel electrode and the other data line, thereby improving the poor image quality and the vertical crosstalk caused by the unequal coupling capacitances CpdL and CpdR on both sides of the pixel electrode.

In comparison with a display panel of the prior art, the coupling capacitance of the pixels in the display panel of the present disclosure can be reduced by about half. Experiments have confirmed that when a grayscale voltage (a voltage value corresponding to a 255-grayscale voltage is 20.7 mV and a voltage value corresponding to 127-grayscale voltage is 10.4 mV) is applied to the display panel of the prior art, a value of a coupling capacitance of one side of a pixel is 1.04 fF, a value of a coupling capacitance of the other side of the pixel is $1.74*10^{-4}$ fF, and a total value of the capacitances of both sides of the pixel is 1.04 fF. Moreover, when a grayscale voltage (a voltage value corresponding to a 255-grayscale voltage is 8.6 mV and a voltage value corresponding to 127-grayscale voltage is 4.3 mV) is applied to the display panel of the present disclosure, a value of a coupling capacitance of one side of a pixel is 0.825 fF, a value of a coupling capacitance of the other side of the pixel is 1.39 fF, and a total value of the capacitances of both sides of the pixel is 0.56 fF. It can be seen from the above that since the opposite sides of each pixel of the present disclosure are adjacent to the data lines, a capacitance difference on both sides of the pixel of the present disclosure is much smaller than a capacitance difference of the prior art. Also, since the polarities of the coupling capacitances on both sides of each pixel are opposite, they can cancel each other out. Therefore, the total value of the capacitances of the pixel of the present disclosure is less than the total value of the capacitances of the pixel of the prior art.

It should be understood that the connection manner between the data lines and the pixels of the display panel in FIG. 3 is only an example that can be implemented. For a display panel that has a structure of two columns of pixels disposed between two adjacent data lines, the data line with the branch portion as described above can be set. The two adjacent columns of the pixels are disposed between two adjacent data lines, and each of the two adjacent data lines includes the branch portions extending to the position between the two adjacent columns of the pixels, so that the opposite sides of each pixel are adjacent to the data lines. In addition, the two adjacent data lines transmit signals with opposite polarities, and the polarities of the coupling capacitances on both sides of each pixel are opposite, which can cancel each other out. Therefore, the problems of poor image quality and vertical crosstalk caused by the unequal coupling capacitances on both sides of the pixel is improved.

Figure 4:
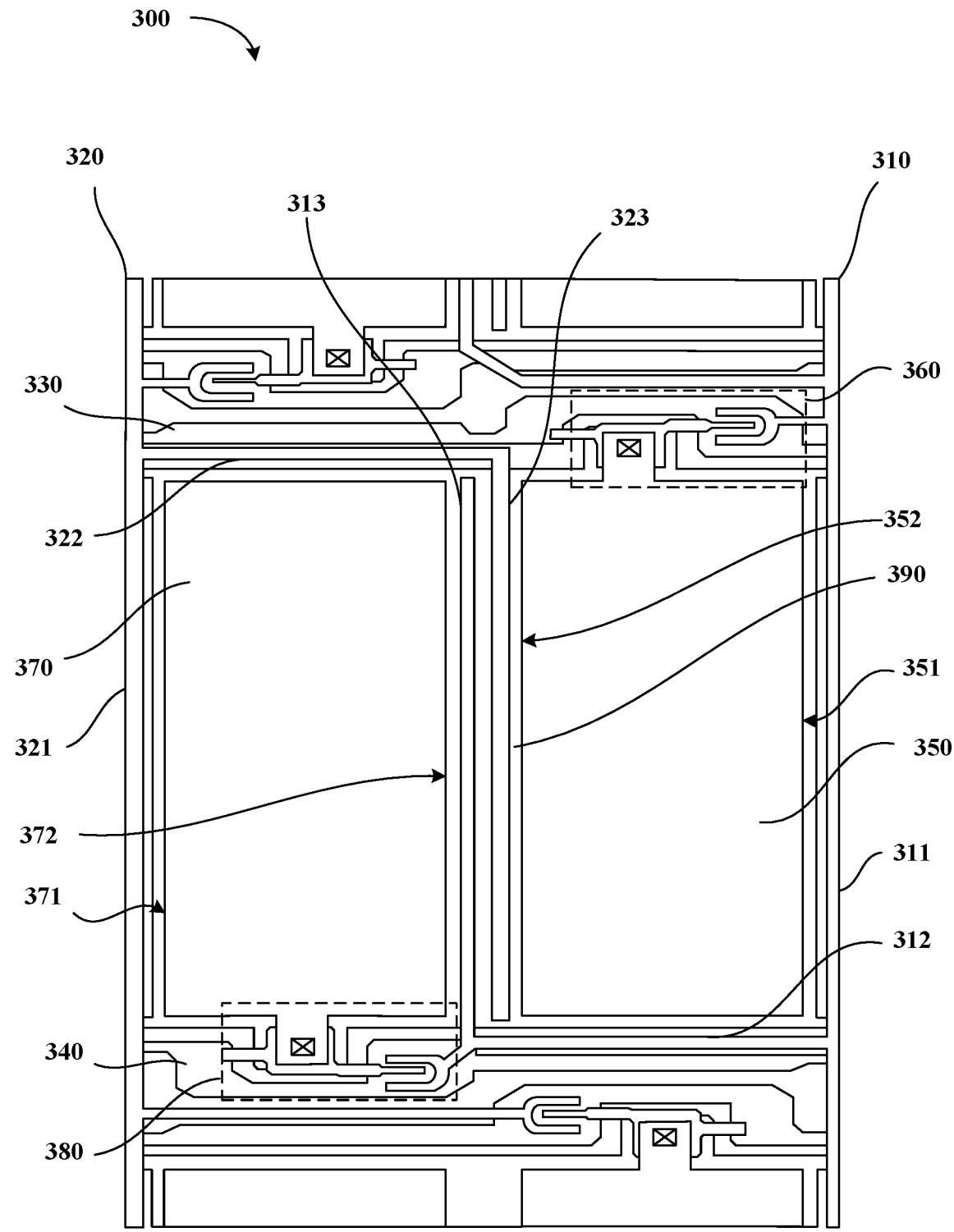
FIG. 4 shows a schematic diagram of a pixel array of a display panel of a first embodiment of the present disclosure.

Referring to FIG. 4, which shows a schematic diagram of a pixel array 300 of a display panel of a first embodiment of the present disclosure. The pixel array 300 includes a plurality of data lines, a plurality of gate lines, and a plurality of pixels. The plurality of data lines includes a first data line 310 and a second data line 320 extending along the column direction. The plurality of gate lines includes a first gate line 330 and a second gate line 340 extending along the row direction. Each pixel includes a pixel electrode and an active element. The pixel electrodes arranged in two adjacent columns are disposed between two adjacent data lines are connected to any one of the data lines. Specifically, the first pixel electrode 350 is electrically connected to the first data line 310 through a first active element 360, and the second pixel electrode 370 is electrically connected to the first data line 310 through a second active element 380. The first pixel electrode 350 and the second pixel electrode 370 are adjacent in the row direction, and are disposed between the first data line 310 and the second data line 320, and also are disposed between the first gate line 330 and the second gate line 340.

As shown in FIG. 4, the first pixel electrode 350 includes a first side 351 and a second side 352 opposite to the first side 351. The first data line 310 is adjacent to the first side 351 of the first pixel electrode 350, and a portion of the first data line 310 extends to the second side 352. Specifically, the first data line 310 includes a first trunk portion 311 and first branch portions. The first trunk portion 311 extends along the column direction, is configured to be electrically connected to a plurality of pixel electrodes arranged along the column direction, and is adjacent to the first side 351 of the first pixel electrode 350. One of the first branch portions extends from the first trunk portion 311 to be adjacent to the second side 352 of the first pixel electrode 350. Specifically, the first branch portion includes a first transverse portion 312 and a first longitudinal portion 313. The first transverse portion 312 extends along the row direction and is configured to connect the first trunk portion 311 and the first longitudinal portion 313. The first longitudinal portion 313 extends along the column direction and extends to the second side 352 of the first pixel electrode 350.

As shown in FIG. 4, the second pixel electrode 370 includes a third side 371 and a fourth side 372 opposite to the third side 371. The second data line 320 is adjacent to the third side 371 of the second pixel electrode 370 and a portion of the second data line 320 extends to the fourth side 372. Specifically, the second data line 320 includes a second trunk portion 321 and second branch portions. The second trunk portion 321 extends along the column direction, is configured to be electrically connected to a plurality of pixel electrodes arranged along the column direction, and is adjacent to the third side 371 of the second pixel electrode 370. One of the second branch portions extends from the second trunk portion 321 to be adjacent to the fourth side 372 of the second pixel electrode 370. Specifically, the second branch portion includes a second transverse portion 322 and a second longitudinal portion 323. The second transverse portion 322 extends along the row direction and is configured to connect the second trunk portion 321 and the second longitudinal portion 323. The second longitudinal portion 323 extends along the column direction and extends to the fourth side 372 of the second pixel electrode 370.

As shown in FIG. 4, the first longitudinal portion 313 of the first branch portion of the first data line 310 is disposed between the fourth side 372 of the second pixel electrode 370 and the second longitudinal portion 323 of the second branch portion of the second data line 320. Moreover, the second longitudinal portion 323 of the second branch portion of the second data line 320 is disposed between the second side 352 of the first pixel electrode 350 and the first longitudinal portion 313 of the first branch portion of the first data line 310. That is, the first side 351 of the first pixel electrode 350 is adjacent to the first trunk portion 311 of the first data line 310. The second side 352 of the first pixel electrode 350 is adjacent to the second longitudinal portion 323 of the second branch portion of the second data line 320. The third side 371 of the second pixel electrode 370 is adjacent to the second trunk portion 321 of the second data line 320. The fourth side 372 of the second pixel electrode 370 is adjacent to the first longitudinal portion 313 of the first branch portion of the first data line 310.

As shown in FIG. 4, the pixel array 300 also includes a common electrode 390. The common electrode 390 is disposed between the first pixel electrode 350 and the second pixel electrode 370, and overlaps with the first longitudinal portion 313 of the first data line 310 and the second longitudinal portion 323 of the second data line 320.

In this embodiment, the first data line 310 is configured to transmit a signal with a first polarity, and the second data line 320 is configured to transmit a signal with a second polarity opposite to the first polarity. That is, when the first data line 310 transmits the signal with the first polarity, the second data line 320 transmits the signal with the second polarity. As shown in FIG. 4, the first side 351 of the first pixel electrode 350 is adjacent to the first data line 310 of the first polarity, and the second side 352 of the first pixel electrode 350 is adjacent to the second data line 320 of the second polarity. Similarly, the third side 371 of the second pixel electrode 370 is adjacent to the second data line 320 of the second polarity, and the fourth side 372 of the second pixel electrode 370 is adjacent to the first data line 310 of the first polarity. It can be seen from the above that the polarities of the coupling capacitances on both sides of each pixel are opposite, which can cancel each other out.

On the other hand, it should be noted that a passivation layer is usually disposed between the pixel electrodes and the data lines, and a coupling capacitance Cpd is generated between the pixel electrode and the data line, and the coupling capacitance Cpd can be presented as:

$$Cpd = \varepsilon 0 * \varepsilon r * S / d \qquad (1)$$

In the equation (1), $\varepsilon 0$ represents a vacuum dielectric constant, $\varepsilon r$ represents a relative dielectric constant of the passivation layer, S represents an overlap area of the pixel electrode and the data line, and d represents a distance between the pixel electrode and the data line. It can be seen from the equation (1) that the coupling capacitance of the pixel electrode is positively correlated with the distance of the data line. In some embodiments, a distance between one pixel electrode of the present disclosure and one of the data lines is similar to a distance between the pixel electrode and the other data line. For example, as shown in FIG. 4, the first side 351 of the first pixel electrode 350 is adjacent to the first trunk portion 311 of the first data line 310. The second side 352 of the first pixel electrode 350 is adjacent to the second longitudinal portion 323 of the second data line 320. Preferably, a distance between the first side 351 and the first trunk portion 311 of the first pixel electrode 350 is equal to a distance between the second side 352 and the second longitudinal portion 323 of the first pixel electrode 350. That is, in this embodiment, the opposite sides of each pixel are equidistant from the adjacent data lines, there is no other pixel disposed between the side of the pixel and the data line, and the polarities of the coupling capacitances on both sides of each pixel are opposite, so that the coupling capacitance CpdL between one pixel and one of the data lines is similar to the coupling capacitance CpdR between the pixel and the other data line, thereby improving the poor image quality and the vertical crosstalk caused by the unequal coupling capacitances CpdL and CpdR on both sides of the pixel. On the other hand, it can be seen from the equation (1) that the coupling capacitance of the pixel electrode is positively correlated with the overlap area of the pixel electrode and the data line. In some embodiments, widths of the trunk portion and the longitudinal portion of each data line are equal. That is, the widths of the first trunk portion 311 of the first data line 310 and the second longitudinal portion 323 of the second data line 320 adjacent to both sides of the first pixel electrode 350 are equal, so that the overlap areas between adjacent data lines on both sides of the first pixel electrode 350 are equal.

Figure 5:
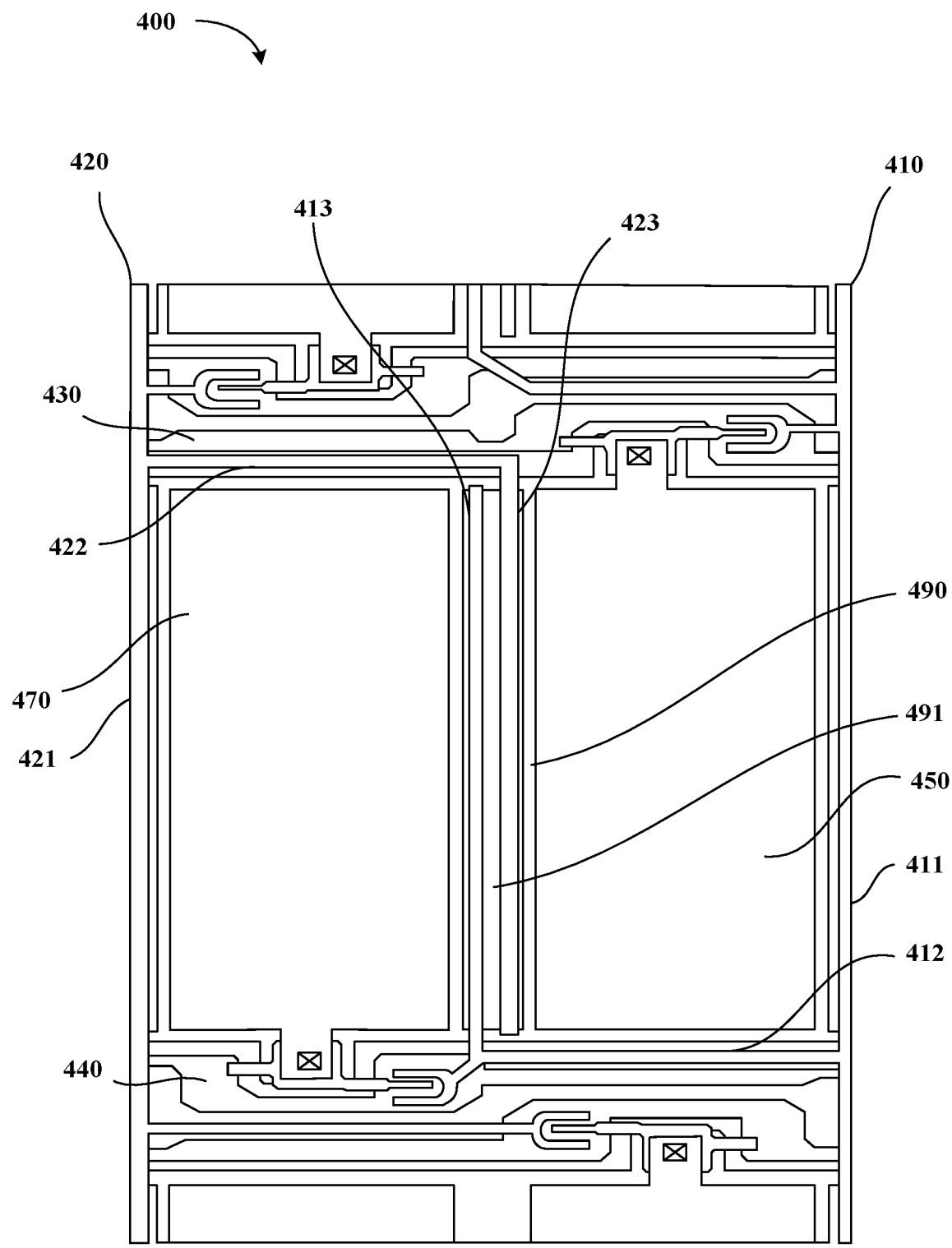
FIG. 5 shows a schematic diagram of a pixel array of a display panel of a second embodiment of the present disclosure.

Referring to FIG. 5, which shows a schematic diagram of a pixel array 400 of a display panel of a second embodiment of the present disclosure. The pixel array 400 includes a plurality of data lines, a plurality of gate lines, and a plurality of pixels. The plurality of data lines includes a first data line 410 and a second data line 420 extending along the column direction. The plurality of gate lines includes a first gate line 430 and a second gate line 440 extending along the row direction. Each pixel includes a pixel electrode and an active element. The first pixel electrode 450 is electrically connected to the first data line 410 through a first active element, and the second pixel electrode 470 is electrically connected to the first data line 410 through a second active element. The first pixel electrode 450 and the second pixel electrode 470 are adjacent in the row direction, and are disposed between the first data line 410 and the second data line 420, and are also disposed between the first gate line 430 and the second gate line 440.

As shown in FIG. 5, the first data line 410 includes a first trunk portion 411 and first branch portions. The first trunk portion 411 extends along the column direction, is configured to be electrically connected to a plurality of pixel electrodes arranged along the column direction, and is adjacent to a first side of the first pixel electrode 450. One of the first branch portion includes a first transverse portion 412 and a first longitudinal portion 413. The first transverse portion 412 extends along the row direction and is configured to connect the first trunk portion 411 and the first longitudinal portion 413. The first longitudinal portion 413 extends along the column direction and extends to a second side of the first pixel electrode 450. The second data line 420 includes a second trunk portion 421 and second branch portions. The second trunk portion 421 extends along the column direction, is configured to be electrically connected to a plurality of pixel electrodes arranged along the column direction, and is adjacent to a third side of the second pixel electrode 470. One of the second branch portion includes a second transverse portion 422 and a second longitudinal portion 423. The second transverse portion 422 extends along the row direction and is configured to connect the second trunk portion 4321 and the second longitudinal portion 423. The second longitudinal portion 423 extends along the column direction and extends to a fourth side of the second pixel electrode 450.

As shown in FIG. 5, a structure of the pixel array 400 of the second embodiment is substantially the same as a structure of the pixel array 300 of the first embodiment. A difference between the two is that a common electrode 490 of the pixel array 400 of the second embodiment includes a slit 491 extending along the column direction. The common electrode 490 is disposed between the first pixel electrode 450 and the second pixel electrode 450, and the slit 491 of the common electrode 490 overlaps the first longitudinal portion 413 of the first data line 410 and the second longitudinal portion 423 of the second data line 420. Specifically, orthographic projections of the first longitudinal portion 413 of the first data line 410 and the second longitudinal portion 423 of the second data line 420 on the common electrode 490 are located within the slit 491 of the common electrode 490.

As shown in FIG. 5, in the present disclosure, in addition to the pixel electrode will cause the coupling capacitances with the data lines on both sides, the data line will also cause a coupling capacitance with the opposite common electrode. The coupling capacitance between the data line and the common electrode is positively correlated with an overlap area of the two. In the second embodiment, by forming the slit 491 on the common electrode 490, the overlap areas of the common electrode 490 and the first longitudinal portion 413 of the first data line 410 and the second longitudinal portion 423 of the second data line 420 can be effectively reduced, so as to reduce the coupling capacitance between the first longitudinal portion 413 of the first data line 410 and the common electrode 490 and reduce the coupling capacitance between the second longitudinal portion 423 of the second data line 420 and the common electrode 490, thereby improving a charging efficiency. Thus, in this embodiment, the common electrode 490 including the slit 491 can effectively reduce the coupling capacitance between the branch portion of the data line and the common electrode 490, thereby preventing the problem of low panel charging efficiency due to an excessive coupling capacitance. Experiments have confirmed that when resistance values of resistors are the same, the coupling capacitance between the common electrode 490 with the slit 491 and the data line is about half of the coupling capacitance between the common electrode without the slit and the data line. It should be noted that in this embodiment, the slit 491 of the common electrode 490 is a single long and narrow slit. However, in other embodiments, the slit 491 of the common electrode 490 may be formed of a plurality of sub-slits arranged at intervals along the column direction, which is not limited thereto.

In summary, the present disclosure provides two adjacent columns of pixels between two adjacent data lines, and each of the two adjacent data lines includes branch portions extending between the two adjacent columns of pixels, so that opposite sides of each pixel are adjacent to the data lines. Moreover, the two adjacent data lines transmit signals with opposite polarities, and the polarities of coupling capacitances on both sides of each pixel are opposite, which can cancel each other out. Therefore, the problems of poor image quality and vertical crosstalk caused by the unequal coupling capacitances on both sides of the pixel is improved. Furthermore, the common electrode including the slit can effectively reduce the coupling capacitance between the branch portion of the data line and the common electrode, thereby preventing a problem of low panel charging efficiency due to an excessive coupling capacitance.

The pixel array, the display panel, and the display device of the embodiments of the present disclosure are described in detail above. Specific embodiments are used in this specification to illustrate the principle and implementations of the present disclosure. The description of the above embodiments is only used to help understand the technical solutions of the present disclosure and its core idea. Those of ordinary skill in the art should understand that they can still modify the technical solutions described in the foregoing embodiments, or equivalently replace some of the technical features. However, these modifications or replacements do not cause the essence of the corresponding technical solutions to deviate from the scope of the technical solutions of the embodiments of the present disclosure.

What is claimed is:

1. A pixel array, comprising:
   a first pixel electrode comprising a first side and a second side opposite to the first side;
   a first data line electrically connected to the first pixel electrode, wherein the first data line is adjacent to the first side of the first pixel electrode and extends to the second side; and
   a second data line adjacent to the first data line, wherein at least a portion of the second data line is disposed between the second side and the first data line, and the first data line and the second data line are respectively configured to transmit signals with opposite polarities.

2. The pixel array according to claim 1, wherein a coupling capacitance between the first pixel electrode and the first data line and a coupling capacitance between the first pixel electrode and the second data line are similar in value and opposite in polarity.

3. The pixel array according to claim 1, wherein the first data line comprises:
   a first trunk portion extending along a column direction, configured to electrically connect a plurality of pixel electrodes arranged along the column direction, and adjacent to the first side of the first pixel electrode; and
   a first branch portion extending from the first trunk portion to the second side of the first pixel electrode.

4. The pixel array according to claim 3, wherein the first branch portion comprises:
   a first longitudinal portion extending along the column direction and adjacent to the second side of the first pixel electrode; and
   a first transverse portion extending along a row direction and configured to connect the first trunk portion and the first longitudinal portion.

5. The pixel array according to claim 4, wherein the second data line comprises:
   a second trunk portion extending along the column direction and configured to connect to a plurality of pixel electrodes arranged along the column direction;
   a second longitudinal portion extending along the column direction and disposed between the second side of the first pixel electrode and the first branch portion of the first data line; and
   a second transverse portion extending along the row direction and configured to connect the second trunk portion and the second longitudinal portion.

6. The pixel array according to claim 5, wherein widths of the first trunk portion of the first data line and the second longitudinal portion of the second data line are equal; and
   a distance between the first side of the first pixel electrode and the first trunk portion is equal to a distance between the second side of the first pixel electrode and the second longitudinal portion.

7. The pixel array according to claim 5, further comprising a second pixel electrode disposed between the first pixel electrode and the second data line, wherein the second pixel electrode comprises a third side and a fourth side opposite to the third side, the second trunk portion of the second data line is adjacent to the third side of the second pixel electrode, and the first branch portion of the first data line extends to a position between a second branch portion of the second data line and the fourth side of the second pixel electrode.

8. The pixel array according to claim 7, further comprising a common electrode disposed between the first pixel electrode and the second pixel electrode, wherein the common electrode comprises at least one slit, and at least part of orthographic projections of the first data line and the second data line on the common electrode is in the at least one slit of the common electrode.

9. A display panel, comprising:
   a plurality of data lines extending along a column direction, wherein two adjacent data lines transmit signals with opposite polarities;
   a plurality of gate lines extending along a row direction; and
   a plurality of pixel electrodes arranged in an array along the row direction and the column direction, wherein two columns of the pixel electrodes are disposed between two adjacent data lines, and two gate lines are disposed between two adjacent rows of the pixel electrodes;
   wherein the data line further comprises a branch portion, and the branch portion extends to a position between two adjacent columns of the pixel electrodes.

10. The display panel according to claim 9, wherein the two adjacent data lines comprises a first data line and a second data line, and the two adjacent columns of the pixel electrodes comprises a first column of the pixel electrodes and a second column of the pixel electrodes, wherein the first data line is adjacent to the first column of the pixel electrodes, and the second data line is adjacent to the second column of the pixel electrodes; and
   wherein a branch portion of the first data line extends to a position between the second column of the pixel electrodes and the branch portion of the second data line, and a branch portion of the second data line extends to a position between the first column of the pixel electrodes and the branch portion of the first data line.

11. The display panel according to claim 9, wherein the two columns of the pixel electrodes disposed between the two adjacent data lines are correspondingly connected to one of the data lines.

12. A display device, comprising:
   a pixel array comprising:
      a first pixel electrode comprising a first side and a second side opposite to the first side;
      a first data line electrically connected to the first pixel electrode, wherein the first data line is adjacent to the first side of the first pixel electrode and extends to the second side; and
      a second data line adjacent to the first data line, wherein at least a portion of the second data line is disposed between the second side and the first data line, and the first data line and the second data line are respectively configured to transmit signals with opposite polarities;
   a controller configured to generate data control signals; and
   a source driver connected to the controller and the first data line or the second data line of the pixel array, and configured to generate signals with corresponding polarities according to the data control signals to control the first data line and the second data line transmitting the signals with opposite polarities.

13. The display device according to claim 12, wherein a coupling capacitance between the first pixel electrode and the first data line and a coupling capacitance between the first pixel electrode and the second data line are similar in value and opposite in polarity.

14. The display device according to claim 12, wherein the first data line comprises:
   a first trunk portion extending along a column direction, configured to electrically connect a plurality of pixel electrodes arranged along the column direction, and adjacent to the first side of the first pixel electrode; and
   a first branch portion extending from the first trunk portion to the second side of the first pixel electrode.

15. The display device according to claim 14, wherein the first branch portion comprises:
   a first longitudinal portion extending along the column direction and adjacent to the second side of the first pixel electrode; and
   a first transverse portion extending along a row direction and configured to connect the first trunk portion and the first longitudinal portion.

16. The display device according to claim 15, wherein the second data line comprises:

a second trunk portion extending along the column direction and configured to connect to a plurality of pixel electrodes arranged along the column direction;

a second longitudinal portion extending along the column direction and disposed between the second side of the first pixel electrode and the first branch portion of the first data line; and a second transverse portion extending along the row direction and configured to connect the second trunk portion and the second longitudinal portion.

17. The display device according to claim 16, wherein widths of the first trunk portion of the first data line and the second longitudinal portion of the second data line are equal; and a distance between the first side of the first pixel electrode and the first trunk portion is equal to a distance between the second side of the first pixel electrode and the second longitudinal portion.

18. The display device according to claim 16, wherein the pixel array further comprises a second pixel electrode disposed between the first pixel electrode and the second data line, the second pixel electrode comprises a third side and a fourth side opposite to the third side, the second trunk portion of the second data line is adjacent to the third side of the second pixel electrode, and the first branch portion of the first data line extends to a position between a second branch portion of the second data line and the fourth side of the second pixel electrode.

19. The display device according to claim 18, wherein the pixel array further comprises a common electrode disposed between the first pixel electrode and the second pixel electrode, the common electrode comprises at least one slit, and at least part of orthographic projections of the first data line and the second data line on the common electrode is in the at least one slit of the common electrode.

* * * * *